United States Patent
Kim

(10) Patent No.: US 9,859,008 B1
(45) Date of Patent: Jan. 2, 2018

(54) CONTROL CIRCUIT, PERIPHERAL CIRCUIT, SEMICONDUCTOR MEMORY DEVICE AND METHOD OF OPERATING THE SAME

(71) Applicant: SK hynix Inc., Icheon-si, Gyeonggi-do (KR)

(72) Inventor: Da U Ni Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/421,067

(22) Filed: Jan. 31, 2017

(30) Foreign Application Priority Data

Sep. 8, 2016 (KR) .......................... 10-2016-0115797

(51) Int. Cl.
  *G11C 16/24* (2006.01)
  *G11C 16/12* (2006.01)
  *G11C 16/26* (2006.01)
  *G11C 16/10* (2006.01)

(52) U.S. Cl.
  CPC .............. *G11C 16/12* (2013.01); *G11C 16/10* (2013.01); *G11C 16/24* (2013.01); *G11C 16/26* (2013.01)

(58) Field of Classification Search
  CPC ......... G11C 16/10; G11C 16/24; G11C 16/18; G11C 16/28

USPC .............. 365/185.19, 185.25, 185.18, 185.28
See application file for complete search history.

(56) References Cited

U.S. PATENT DOCUMENTS

| | | | | |
|---|---|---|---|---|
| 2001/0014037 | A1* | 8/2001 | Kim ..................... | G11C 16/12 365/185.18 |
| 2006/0092703 | A1* | 5/2006 | Chae .................... | G11C 16/10 365/185.18 |
| 2010/0302851 | A1* | 12/2010 | Ryu ..................... | G11C 16/24 365/185.12 |
| 2014/0043915 | A1* | 2/2014 | Choi .................... | G11C 16/10 365/185.25 |

FOREIGN PATENT DOCUMENTS

KR 1020150001134 A 1/2015

* cited by examiner

*Primary Examiner* — Vu Le
(74) *Attorney, Agent, or Firm* — William Park & Associates Ltd.

(57) ABSTRACT

Provided herein may be a control circuit, peripheral circuit, semiconductor memory device and methods of operating the device and circuits. The method of operating a semiconductor memory device may include applying a control signal having a form, in which a step pulse is combined with a ramp signal, to a gate electrode of a transistor for setting up a voltage of a bit line of the selected memory cell. The method of operating a semiconductor memory device may include applying a program pulse to a word line of the selected memory cell.

12 Claims, 11 Drawing Sheets

CONTROL CIRCUIT, PERIPHERAL CIRCUIT, SEMICONDUCTOR MEMORY DEVICE AND METHOD OF OPERATING THE SAME

CROSS-REFERENCE TO RELATED APPLICATION

The present application claims priority under 35 U.S.C. §119(a) to Korean patent application number 10-2016-0115797 filed on Sep. 8, 2016 in the Korean Intellectual Property Office, the entire disclosure of which is incorporated herein by reference.

BACKGROUND

1. Technical Field

Various embodiments of the present disclosure may generally relate to an electronic device, and more particularly, to a control circuit, peripheral circuit, semiconductor memory device and a method of operating the semiconductor memory device and circuits.

2. Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

In an embodiment, a method of operating a semiconductor memory device may be provided. The method may include applying a control signal having a form, in which a step pulse is combined with a ramp signal, to a gate electrode of a transistor for setting up a voltage of a bit line of the selected memory cell. The method may include applying a program pulse to a word line of the selected memory cell.

The present disclosure may provide for a semiconductor memory device. The semiconductor memory device may include a cell array including a plurality of memory cells. The semiconductor memory device may include a page buffer configured to provide a setup voltage to a bit line of a selected memory cell during a program operation. The semiconductor memory device may include a control circuit configured to control the page buffer so that a control signal having a form, in which a step pulse may be combined with a ramp signal, may be applied to a gate electrode of a transistor that may be included in the page buffer and that may set up a voltage of the bit line.

The present disclosure may provide a semiconductor memory device. The semiconductor memory device may include a cell array including a plurality of memory cells. The semiconductor memory device may include a page buffer configured to provide a setup voltage to a bit line of a selected memory cell during a program operation. The semiconductor memory device may include a control circuit configured to apply a first control signal having a level of a reference voltage to a gate electrode of a transistor that is included in the page buffer and that sets up a voltage of the bit line and to apply a second control signal that may be increased to a target setup voltage of the bit line over time if a preset reference time has elapsed.

The present disclosure may provide a method for controlling a peripheral circuit. The method may include applying a control signal having a form, in which a step pulse is combined with a ramp signal, to a gate electrode of a transistor for setting up a voltage of a bit line during a bit line setup interval based on a program operation. The method may include applying a program voltage to a selected word line.

The present disclosure may provide a bit line setup control unit. The bit line setup control unit may include a reference voltage amplification unit configured to output a step pulse having a level of a reference voltage based on a page buffer sensing enable signal that is inputted only during a bit line setup interval. The bit line setup control unit may include a ramp signal generation unit configured to generate a ramp signal that is increased over time. The bit line setup control unit may include a ramp signal activation unit configured to output the ramp signal as a control signal based on a high-voltage enable signal that is inputted if the bit line setup interval has elapsed.

DETAILED DESCRIPTION

Figure 1:
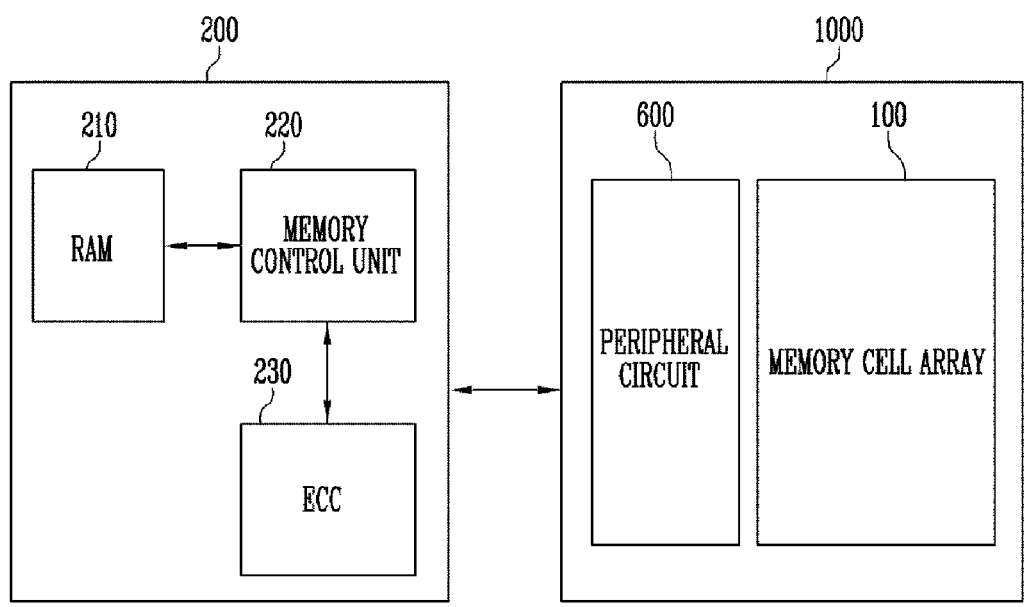
FIG. 1 is a block diagram illustrating a representation of an example of the configuration of a memory system.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the present disclosure will be described by describing examples of embodiments of the present disclosure with reference to the attached drawings. Below, embodiments of the present disclosure will be described with reference to the attached drawings.

Various embodiments of the present disclosure may be directed to a semiconductor memory device which has improved reliability, and a method of operating the semiconductor memory device.

FIG. 1 is a block diagram illustrating the configuration of a memory system.

A memory system 50 includes a semiconductor memory device 1000 and a controller 200.

The semiconductor memory device 1000 includes many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM), for example. The semiconductor memory device 1000 according to the present disclosure may be implemented as a three-dimensional array structure. The present disclosure may also be applied not only to a flash memory in which a charge storage layer is implemented as a conductive floating gate (FG), but also to a charge trap flash (CTF) memory in which a charge storage layer is implemented as an insulating layer.

The semiconductor memory device 1000 includes a memory cell array 100 and a peripheral circuit 600 for driving the memory cell array 100. The memory cell array 100 includes a plurality of nonvolatile memory cells.

The memory cell array 100 includes a plurality of memory blocks, which may be used such that the memory blocks are divided into system blocks and user blocks according to the use thereof.

In an embodiment, the memory cell array 100 may include a Content Addressable Memory (CAM) area. The CAM area may include a plurality of memory cells, which are included in at least one memory block. In the CAM area, various types of setup information required for the operation of the semiconductor memory device 1000 may be stored. For example, in the CAM area, conditions or other pieces of information which are set in relation to a data input and output (input/output) operations may be stored. In an embodiment, in the CAM area, information about the number of read and write (read/write) operations (Program and Erase (Program/Erase) (P/E) cycle), an erroneous column address, and an erroneous block address may be stored. In an embodiment, in the CAM area, option information required for the operation of the semiconductor memory device 1000, for example, program voltage information, read voltage information, erase voltage information, the thickness information of the gate oxide film of each cell, etc., may be stored.

When power is supplied to the semiconductor memory device 1000, information stored in the CAM area is read by the peripheral circuit 600, and the peripheral circuit 600 may control the memory cell array 100 so that the data input/output operation on the memory cells is performed under the set conditions, based on the read information.

The peripheral circuit 600 is operated under the control of the controller 200. The peripheral circuit 600 may program data in the memory cell array 100 under the control of the controller 200. The peripheral circuit 600 may be operated such that data is read from the memory cell array 100 and data in the memory cell array 100 is erased.

In various embodiments, the read operation and the program operation of the semiconductor memory device 1000 may be performed on a page basis. The erase operation of the semiconductor memory device 1000 may be performed on a memory block basis.

During a program operation, the peripheral circuit 600 may receive a command indicating a program operation, a physical block address PBA, and write data from the controller 200. The peripheral circuit 600 may program data in a selected page when a single memory block and a single page included in the corresponding memory block are selected in response to the physical block address PBA.

During a read operation, the peripheral circuit 600 may receive a command indicating a read operation (hereinafter referred to as a "read command") and a physical block address PBA from the controller 200. The peripheral circuit 600 may read data from a single memory block selected in response to the physical block address PBA and from a page included in the memory block, and may output the read data (hereinafter referred to as "page data") to the controller 200.

During an erase operation, the peripheral circuit 600 may receive a command indicating an erase operation and a physical block address PBA from the controller 200. The physical block address PBA may specify a single memory block. The peripheral circuit 600 may erase data stored in the memory block corresponding to the physical block address PBA.

The controller 200 controls the overall operation of the semiconductor memory device 1000. The controller 200 may access the semiconductor memory device 1000 in response to a request from an external host. The controller 200 may provide a command to the semiconductor memory device 1000 in response to the request from the external host.

In an embodiment, the controller 200 may control the semiconductor memory device 1000 so that a program operation, a read operation or an erase operation is performed. In the program operation, the controller 200 may provide the program command, the address and the data to the semiconductor memory device 1000 through a channel. In the read operation, the controller 200 may provide the read command and the address to the semiconductor memory device 1000 through the channel. In the erase operation, the controller 200 may provide the erase command and the address to the semiconductor memory device 1000 through the channel.

The controller 200 may include a Random Access Memory (RAM) 210, a memory control unit 220, and an error correcting code (ECC) circuit 230.

The RAM 210 is operated under the control of the memory control unit 220 and may be used as a work memory, a buffer memory, a cache memory, or the like. When the RAM 210 is used as the work memory, data processed by the memory control unit 220 may be temporarily stored. When the RAM 210 is used as the buffer memory, the RAM may be used to buffer data that is to be transmitted from a host (not illustrated) to the semiconductor memory device 1000 or from the semiconductor memory device 1000 to the host (not illustrated).

The memory control unit 220 is configured to control a read operation, a program operation, an erase operation and a background operation of the semiconductor memory device 1000. The memory control unit 220 is configured to run firmware for controlling the semiconductor memory device 1000.

The memory control unit 220 may perform a function of a Flash Translation Layer (FTL). The memory control unit 220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The ECC circuit 230 generates parity that is an ECC for data to be programmed. Further, during a read operation, the ECC circuit 230 may correct an error from read page data using the parity. The ECC circuit 230 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the ECC circuit 230 may correct errors from read page data. When a number of error bits exceeding the number of correctable bits are included in the read page data, decoding may fail. When a number of error bits less than or equal to the number of correctable bits are included in the page data, decoding may succeed.

A success in decoding indicates that the corresponding read command has passed. A failure in decoding indicates that the corresponding read command has failed. When decoding succeeds, the controller 200 outputs error-corrected page data to the host.

Although not illustrated in the drawing, the controller 200 may further include a memory interface for communicating with the semiconductor memory device 1000. The memory interface includes a protocol for communicating with the semiconductor memory device 1000. For example, the memory interface may include at least one of flash interfaces such as a NAND interface and a NOR interface.

The controller 200 may further include a host interface (not illustrated) to perform data exchange between the host and the controller 200. The host interface includes protocols required for communication between the host and the controller 200. In an example of an embodiment, the controller 200 is configured to communicate with an external system (host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Figure 2:
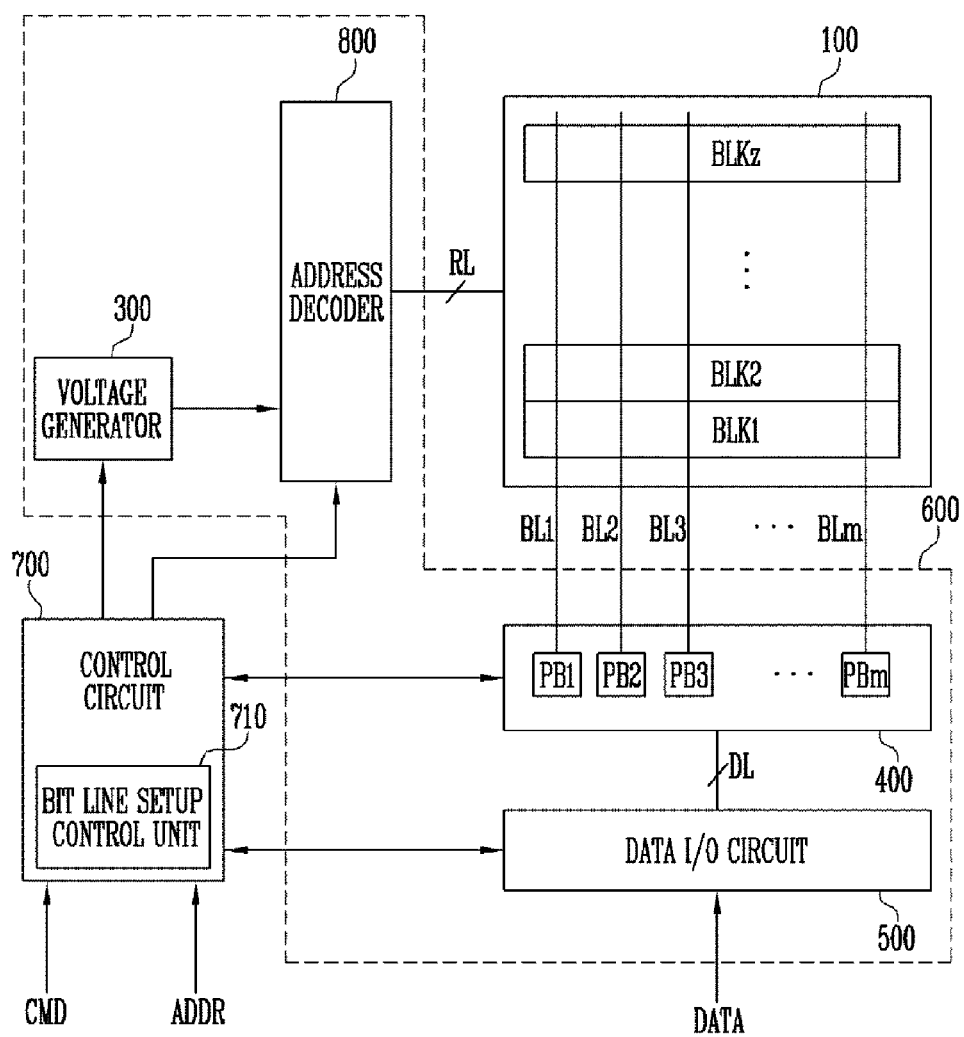
FIG. 2 is a block diagram illustrating a representation of an example of a semiconductor memory device according to an embodiment of the present disclosure.

FIG. 2 is a block diagram illustrating a representation of an example of a semiconductor memory device according to an embodiment of the present disclosure.

Figure 3:
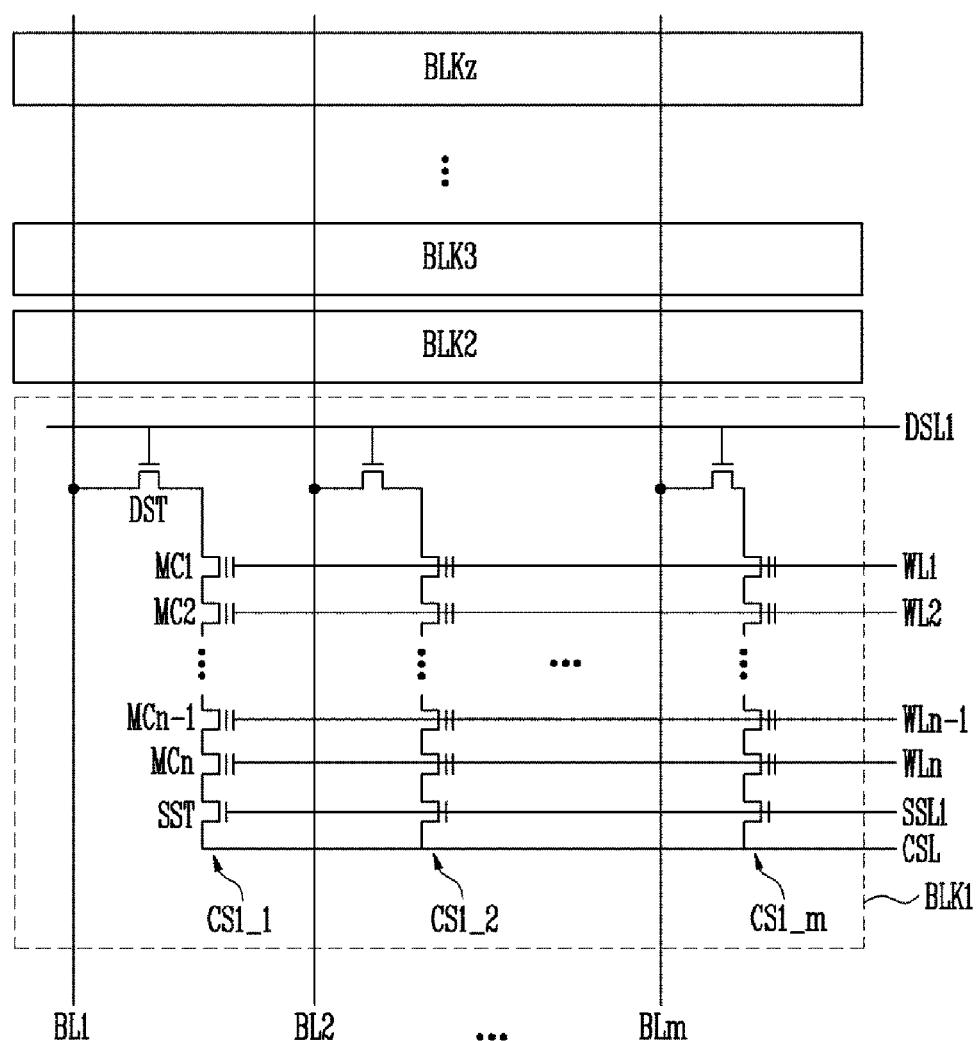
FIG. 3 is a diagram illustrating a representation of an example of the structure of a memory cell array of FIG. 2.

FIG. 3 is a diagram illustrating a representation of an example of the structure of the memory cell array 100 of FIG. 2.

Referring to FIG. 2, a semiconductor memory device 1000 includes the memory cell array 100, a peripheral circuit 600, and a control circuit 700.

The memory cell array 100 includes a plurality of memory blocks BLK1 to BLKz. The plurality of memory blocks BLK1 to BLKz are coupled to an address decoder 800 through row lines RL. The memory blocks BLK1 to BLKz are coupled to a read and write circuit 400 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 100 is composed of a plurality of pages.

The memory cells of the semiconductor memory device 1000 may be each implemented as a single level cell (SLC) capable of storing a single data bit, a multi-level cell (MLC) capable of storing two data bits, a triple-level cell (TLC) capable of storing three data bits, or a quad-level cell (QLC) capable of storing four data bits.

Referring to FIG. 3, first to z-th memory blocks BLK1 to BLKz included in a memory cell array 100_1 are coupled in common to first to m-th bit lines BL1 to BLm. In FIG. 3, for the convenience of description, elements included in the first memory block BLK1, among the plurality of memory blocks BLK1 to BLKz, are illustrated, and respective elements included in remaining memory blocks BLK2 to BLKz are omitted. It will be understood that each of the remaining memory blocks BLK2 to BLKz is configured in the same way as the first memory block BLK1.

The memory block BLK1 includes a plurality of cell strings CS1_1 to CS1_m. The first to m-th cell strings CS1_1 to CS1_m are coupled to the first to m-th bit lines BL1 to BLm, respectively.

Each of the first to m-th cell strings CS1_1 to CS1_m includes a drain select transistor DST, a plurality of series-connected memory cells MC1 to MCn, and a source select transistor SST. The drain select transistor DST is coupled to a drain select line DSL1. The first to n-th memory cells MC1 to MCn are coupled to first to n-th word lines WL1 to WLn, respectively. The source select transistor SST is coupled to a source select line SSL1. A drain of the drain select transistor DST is coupled to the corresponding bit line. Drain select transistors of the first to m-th cell strings CS1_1 to CS1_m are coupled to the first to m-th bit lines BL1 to BLm, respectively. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 800. The common source line CSL is controlled by the control circuit 700. The first to m-th bit lines BL1 to BLm are controlled by a read and write circuit 400.

Referring back to FIG. 2, the peripheral circuit 600 may include the address decoder 800, a voltage generator 300, the read and write circuit 400, and a data input/output (I/O) circuit 500.

The peripheral circuit 600 drives the memory cell array 100 under the control of the control circuit 700. For example, the peripheral circuit 600 may drive the memory cell array 100 so that a program operation, a read operation, and an erase operation are performed under the control of the control circuit 700.

The address decoder 800 is coupled to the memory cell array 100 through the row lines RL. The address decoder 800 is configured to be operated in response to the control of the control circuit 700. The address decoder 800 receives an address ADDR from the control circuit 700 through an input/output buffer (not illustrated) provided in the semiconductor memory device 1000.

The address decoder 800 is configured to decode a block address of the received address ADDR. The address decoder 800 selects at least one memory block from among the memory blocks BLK1 to BLKz in response to the decoded block address. The address decoder 800 is configured to decode a row address of the received address ADDR. The address decoder 800 may select at least one word line of the selected memory block by applying voltages supplied from the voltage generator 300 to at least one word line WL in response to the decoded row address.

During a program operation, the address decoder 800 may apply a program voltage to the selected word line and apply a pass voltage having a level lower than that of the program voltage to unselected word lines. During a program verify operation, the address decoder 800 may apply a verification voltage to a selected word line and apply a verification pass voltage higher than the verification voltage to unselected word lines.

During a read operation, the address decoder 800 may apply a read voltage to a selected word line and apply a pass voltage higher than the read voltage to unselected word lines.

In an embodiment, an erase operation of the semiconductor memory device 1000 is performed on a memory block basis. During an erase operation, the address ADDR inputted to the semiconductor memory device 1000 includes a block address. The address decoder 800 may decode the block address and select a single memory block in response to the decoded block address. During an erase operation, the address decoder 800 may apply a ground voltage to a word line coupled to the selected memory block. In an embodiment, the address decoder 800 may include a block decoder, a word line decoder, an address buffer, etc.

The voltage generator 300 is configured to generate a plurality of voltages using an external supply voltage provided to the semiconductor memory device 1000. The voltage generator 300 is operated under the control of the control circuit 700.

In an embodiment, the voltage generator 300 may generate an internal supply voltage by regulating the external supply voltage. The internal supply voltage generated by the voltage generator 300 is used as an operating voltage of the semiconductor memory device 1000.

In an embodiment, the voltage generator 300 may generate a plurality of voltages using the external supply voltage or the internal supply voltage. For example, the voltage generator 300 may include a plurality of pumping capacitors for receiving the internal supply voltage and may generate a plurality of voltages by selectively activating the pumping capacitors under the control of the control circuit 700. The generated voltages are applied to the word lines selected by the address decoder 800.

The read and write circuit 400 includes first to m-th pages buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control circuit 700.

The first to m-th page buffers PB1 to PBm perform data communication with the data I/O circuit 500. During a program operation, the first to m-th page buffers PB1 to PBm receive data to be stored DATA through the data input and output (I/O) circuit 500 and data lines DL.

During a program operation, the first to m-th page buffers PB1 to PBm may transfer the data DATA, received through the data I/O circuit 500, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 400 reads data DATA from the memory cells in the selected page through the bit lines BL, and outputs the read data DATA to the data I/O circuit 500.

During an erase operation, the read and write circuit 400 may float the bit lines BL. In an embodiment, the read and write circuit 400 may include a column select circuit.

The data I/O circuit 500 is coupled to the first to m-th page buffers PB1 to PBm through the data lines DL. The data I/O circuit 500 is operated under the control of the control circuit 700. During a program operation, the data I/O circuit 500 receives data to be stored DATA from an external controller (not illustrated). During a read operation, the data I/O circuit 500 outputs the data, received from the first to m-th page buffers PB1 to PBm included in the read and write circuit 400, to the external controller.

The control circuit 700 is coupled to the address decoder 800, the voltage generator 300, the read and write circuit 400, and the data I/O circuit 500. The control circuit 700 may control the overall operation of the semiconductor memory device 1000. The control circuit 700 receives a command CMD and an address ADDR from the external controller. The control circuit 700 may control the peripheral circuit 600 in response to the command CMD. The control circuit 700 may control the address decoder 800, the voltage generator 300, the read and write circuit 400, and the data I/O circuit 500 so that an operation corresponding to the received command is performed. In an embodiment, the control circuit 700 may apply a high erase voltage Verase to the source line during an erase operation.

A program operation of the semiconductor memory device 1000 may be performed by repeating one or more program loops (PGM loops). A single program loop (PGM Loop) may be divided into a program step at which a program voltage Vpgm is applied and a program verify step. At the program step, the program voltage Vpgm is applied to the word line of selected memory cells. The program step may be sub-divided into a bit line setup (BL Setup) interval, a program execution (PGM Execution) interval, and a bit line discharge (BL Discharge) interval.

The semiconductor memory device 1000 may set up bit lines depending on data to be programmed during the bit line setup interval. The term 'bit line setup (BL Set-up)' denotes an operation of charging the bit line of memory cells to be programmed to 0 V and charging the bit lines of memory cells in which a program operation is prohibited to a supply voltage VDD or Vcc before the program voltage Vpgm is applied to a selected word line. The program execution interval denotes an interval during which the program voltage Vpgm is applied to the selected word line. The bit line discharge interval denotes an interval during which word lines and bit lines are discharged after the program voltage has been applied.

For example, during the bit line setup (BL setup) interval, the first to m-th page buffers PB1 to PBm of the semiconductor memory device 1000 transfer bit line voltages, which correspond to the data to be programmed, to the first to m-th bit lines BL1 to BLm coupled to the memory cell array 100.

During the bit line setup (BL Setup) interval, an operation of charging the bit line of the selected memory cells to the level of the supply voltage VDD or 0 V is performed. During the bit line setup (BL Setup) interval, the bit line of the memory cells to be programmed to a target state may be set to 0 V. On the other hand, the bit lines of the program-prohibited memory cells are set to the supply voltage VDD.

Subsequent to the bit line setup (BL Setup) interval, the program execution (PGM Execution) interval follows. During the program execution interval, the program voltage Vpgm is applied to the word line of the selected memory cells. After the program voltage Vpgm has been applied, the bit line discharge (BL Discharge) interval follows. During the bit line discharge interval, the setup bit line voltage may be discharged to a ground level.

The amount of charges flowing into bit lines having a relatively large capacity to charge the bit lines may rapidly increase. That is, when the amount of inflow charges over time rapidly increases, a high current flows and then a current peak may occur.

The semiconductor memory device 1000 according to the present disclosure may prevent a current peak from occurring by suppressing the rapid increase in the amount of inflow charges under the control of a bit line setup control unit 710 included in the control circuit 700.

For example, the control circuit 700 may include the bit line setup control unit 710. The bit line setup control unit 710 may control the bit line setup of the first to m-th page buffers PB1 to PBm included in the read and write circuit 400. The control of bit line setup may prevent the peak of current that rapidly flows into the bit lines. Each page buffer includes transistors for supplying a setup voltage to the corresponding bit line. Further, the page buffer may be provided with control signals for controlling the transistors from the bit line setup control unit 710 included in the control circuit 700. When a program operation is performed, bit line setup may be controlled in response to the control signals. The control signals required by the bit line setup control unit 710 to control the plurality of transistors included in the page buffer will be described with reference to FIGS. 6 to 8, which will be described later.

According to a present embodiment of the present disclosure, the bit line setup control unit 710 may control the page buffer so that a step pulse corresponding to a reference voltage VREF is applied as a control signal PB_SENSE that is inputted to a gate electrode of a transistor of a page buffer sensing unit included in the page buffer during a bit line setup interval based on a program operation and so that, if a preset reference time has elapsed, a ramp signal having a predetermined gradient is applied to the gate electrode thereof. When a pulse increasing in the form of a step is applied to the gate electrode of the transistor of the page buffer sensing unit, the speed of bit line setup is increased, but a current peak may be caused. When the ramp signal is applied, the bit lines are not set up until the level of the ramp signal exceeds the threshold voltage of the page buffer sensing transistor, and thus a program time tPROG may be increased.

Therefore, in accordance with an embodiment of the present disclosure, the semiconductor memory device 1000 applies a step pulse having a level, which is higher than that of the threshold voltage of the gate electrode of the transistor included in the page buffer sensing unit, to the gate electrode of the transistor of the page buffer sensing unit, and then applies a ramp signal to the gate electrode if a preset reference time has elapsed, thus preventing a current peak from occurring without increasing the time required for bit line setup.

Figure 4:
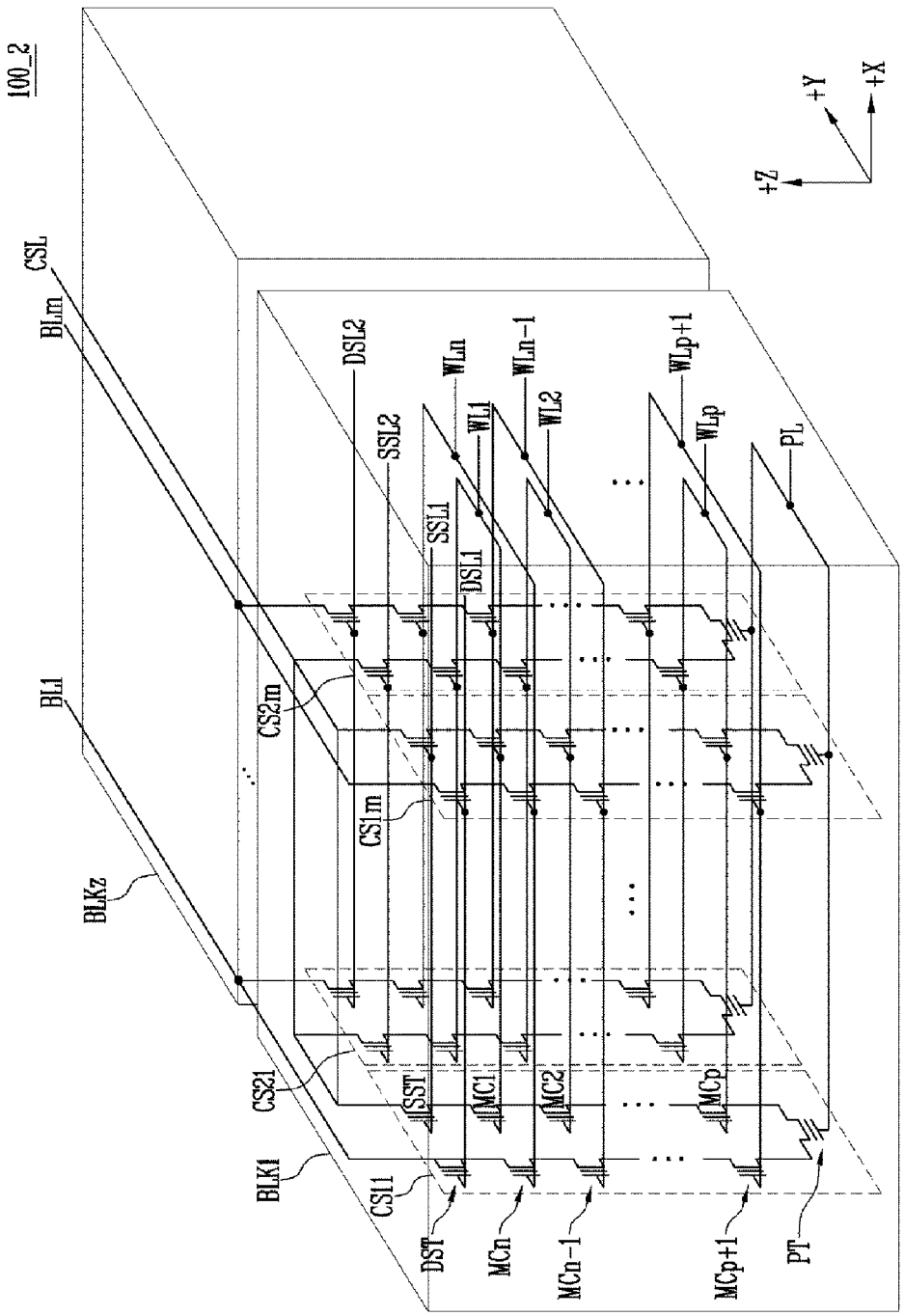
FIG. 4 is a diagram illustrating a representation of an example of an embodiment of the memory cell array of FIG. 2.

FIG. 4 is a diagram illustrating a representation of an example of an embodiment of the memory cell array of FIG. 2.

Referring to FIG. 4, a memory cell array 100_2 includes a plurality of memory blocks BLK1 to BLKz. In FIG. 4, for the convenience of description, the internal configuration of the first memory block BLK1 is illustrated, and the internal configuration of remaining memory blocks BLK2 to BLKz is omitted. It will be understood that the second to z-th memory blocks BLK2 to BLKz are configured in the same way as the first memory block BLK1.

Referring to FIG. 4, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1 is improved.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

Figure 5:
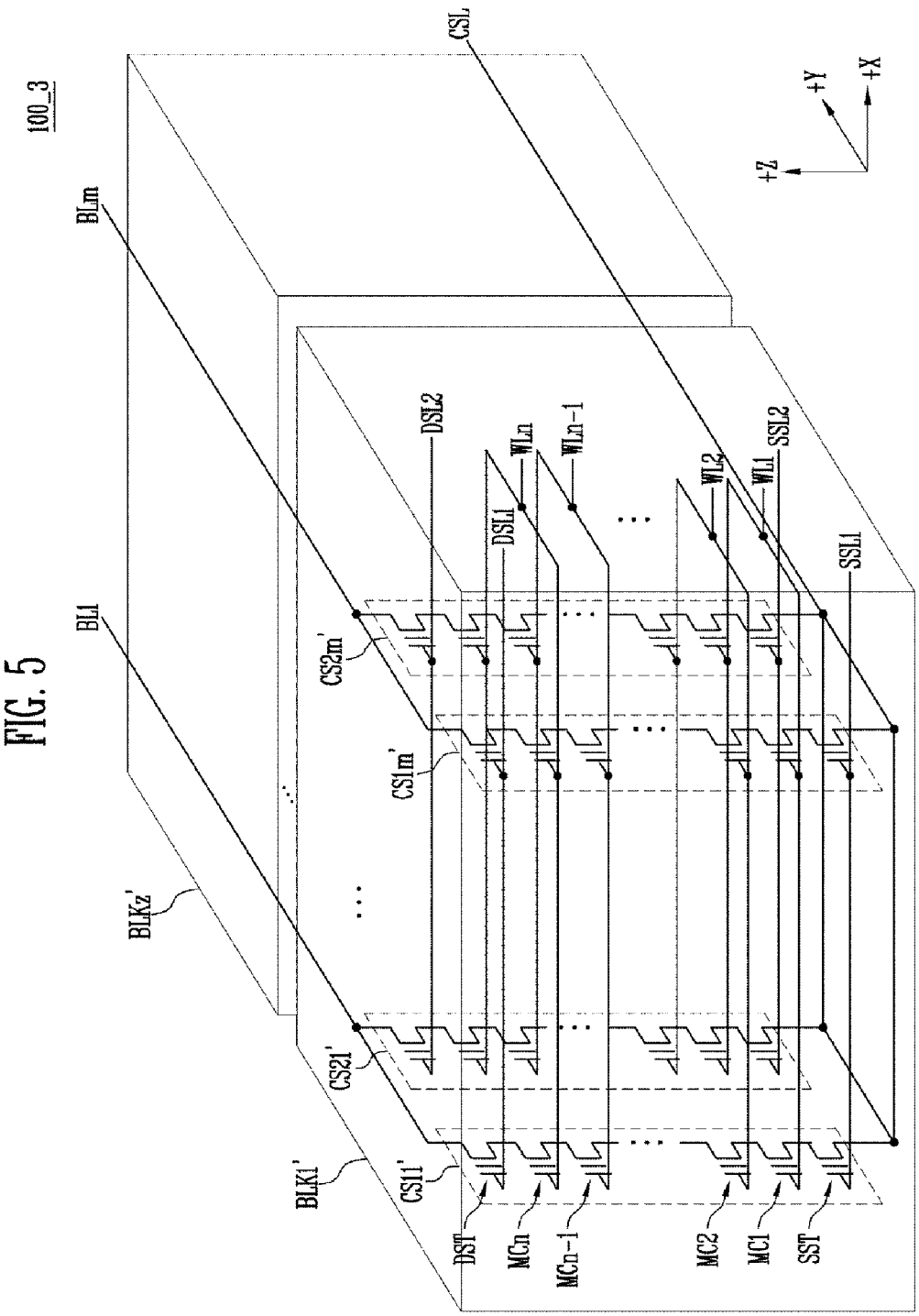
FIG. 5 is a diagram illustrating a representation of an example of an embodiment of the memory cell array of FIG. 2.

FIG. 5 is a diagram illustrating a representation of an example of an embodiment of the memory cell array of FIG. 2.

Referring to FIG. 5, a memory cell array 100_3 includes a plurality of memory blocks BLK1' to BLKz'. In FIG. 5, for the convenience of description, the internal configuration of the first memory block BLK1' is illustrated, and the illustration of the internal configuration of remaining memory blocks BLK2' to BLKz' is omitted. It will be understood that the second to z-th memory blocks BLK2' to BLKz' are configured in the same manner as the first memory block BLK1'.

The first memory block BLK1' includes a plurality of cell strings CS11' to CS1m' and CS21' to CS2m'. Each of the plurality of cell strings CS11' to CS1m' and CS21' to CS2m' is extended along a +Z direction. In the first memory block BLK1, m cell strings are arranged in a +X direction. In FIG. 5, two cell strings are illustrated as being arranged in a +Y direction. However, this configuration is made for the convenience of description, and it will be understood that three or more cell strings may be arranged in a column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line 55L2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1' is improved.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Figure 6:
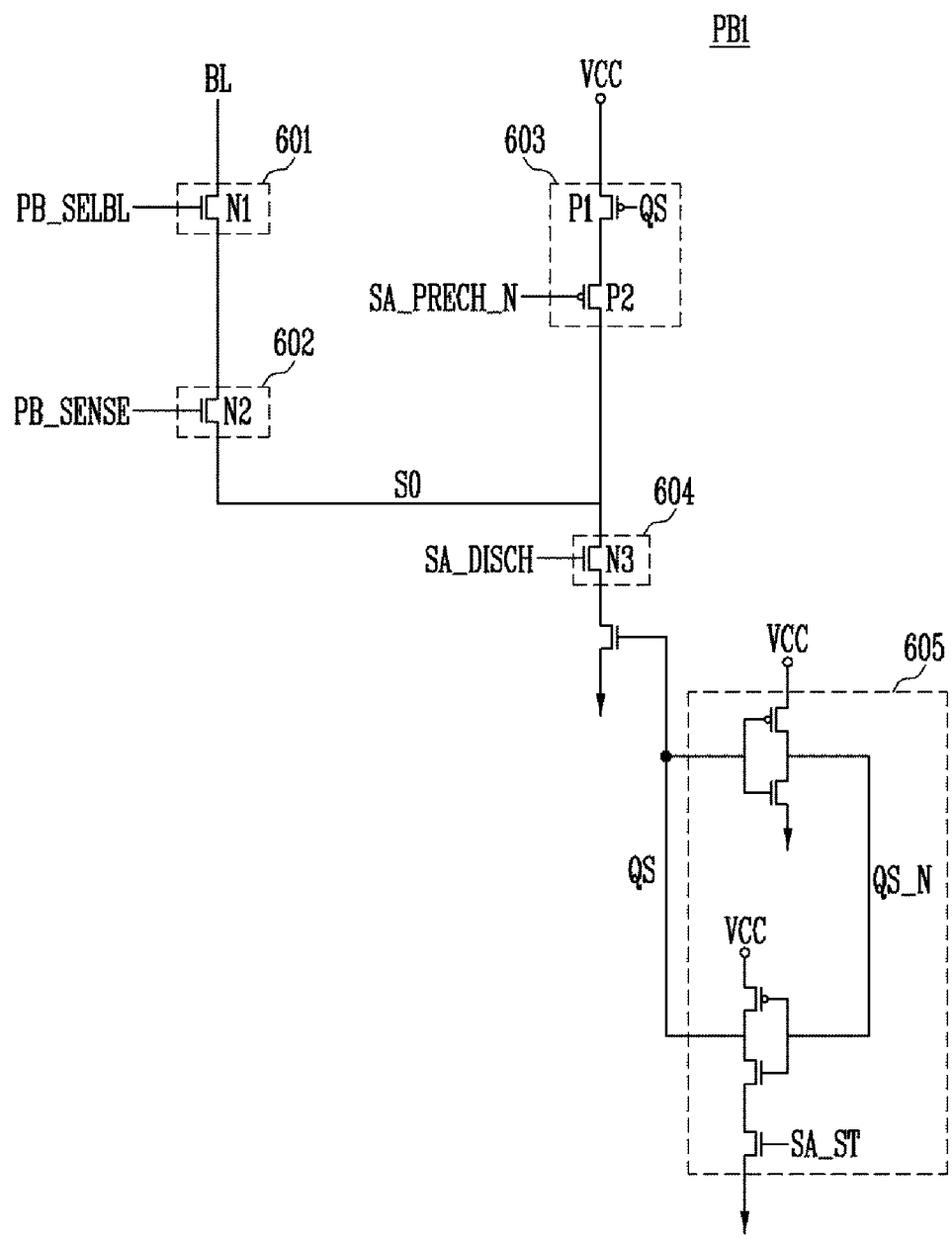
FIG. 6 is a diagram illustrating a representation of an example of the structure of a page buffer of FIG. 2.

FIG. 6 is a diagram illustrating a representation of an example of the structure of the page buffer PB1 of FIG. 2.

In FIG. 6, for the convenience of description, the internal configuration of the first page buffer PB1 is illustrated, and the configuration of remaining page buffers PB2 to PBm is omitted. It will be understood that remaining page buffers PB2 to PBm are configured in the same manner as the first page buffer PB1.

Referring to FIG. 6, the page buffer PB1 may be operated in response to control signals outputted from the control circuit 700 of FIG. 2. Control signals PB_SELBL, PB_SENSE, SA_PRECH_N, SA_DISCH, and SA_ST, which will be described below, may be included in signals outputted from the control circuit 700. In an embodiment, a plurality of control signals in addition to the control signals illustrated in FIG. 6 may be further inputted.

The page buffer PB1 may include a bit line coupling unit 601, a page buffer sensing unit 602, a current control unit 603, a sensing discharge unit 604, and a latch circuit unit 605.

The page buffer PB1 of FIG. 6 will be used, for example, to describe a bit line setup operation. In an embodiment, the page buffer PB1 may include components for performing various functions in addition to the bit line coupling unit 601, the page buffer sensing unit 602, the current control unit 603, the sensing discharge unit 604, and the latch circuit unit 605.

The bit line coupling unit 601 may include an NMOS transistor N1, which is connected between a bit line BL and the page buffer sensing unit 602 and is operated in response to a bit line select signal PB_SELBL. The NMOS transistor N1 may be turned on or off in response to the bit line select signal PB_SELBL.

The page buffer sensing unit 602 may include an NMOS transistor N2, which is connected between the bit line coupling unit 601 and a current sensing node SO and is operated in response to a page buffer sensing signal PB_SENSE. The NMOS transistor N2 may be turned on or off in response to the page buffer sensing signal PB_SENSE.

The current control unit 603 may include PMOS transistors P1 and P2. The PMOS transistor P1 may be connected between a core voltage terminal VCC and the PMOS transistor P2 and may be turned on or off in response to the potential of a first node QS. The PMOS transistor P2 may generate a current for precharging the bit line BL on the current sensing node SO in response to a current precharge signal SA_PRECH_N.

The sensing discharge unit 604 may include an NMOS transistor N3, which is connected between the current sensing node SO and a detection node and is operated in response to a sense amplifier (amp) discharge signal SA_DISCH. The NMOS transistor N3 may be turned on or off in response to the sense amp discharge signal SA_DISCH. The sensing discharge unit 604 may discharge the current sensing node SO.

The latch circuit unit 605 includes a sensing latch. In an embodiment, the sensing latch includes inverters, which may be connected in parallel between the first node QS and the second node QS_N of the sensing latch.

According to an embodiment of the present disclosure, the bit line setup control unit 710 of FIG. 2 outputs the page buffer sensing signal PB_SENSE to be applied to the gate electrode of the NMOS transistor N2 included in the page buffer sensing unit 602 to set up the bit line. For example, the page buffer sensing signal PB_SENSE that is applied during a bit line setup interval may be a signal having a form in which a step signal having a reference voltage level is combined with a ramp signal. Here, the reference signal may have a level higher than that of the threshold voltage of the NMOS transistor N2. The step signal may be applied during at least a minimum time required to turn on the NMOS transistor N2.

Figure 7:
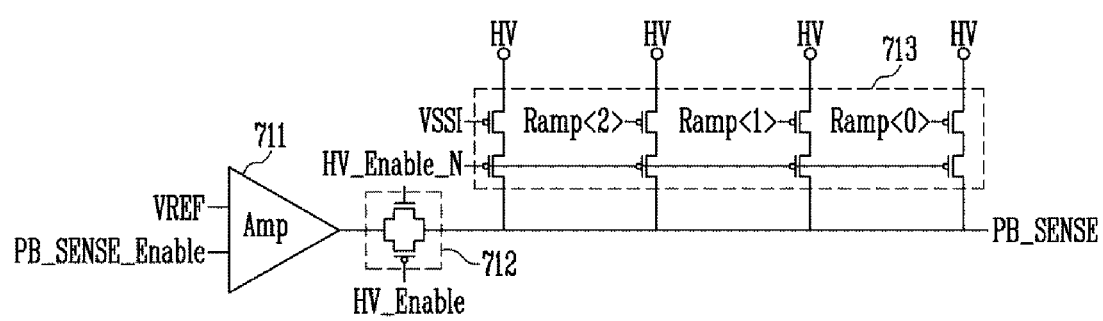
FIG. 7 is a diagram illustrating a representation of an example of the structure of a bit line setup control unit of FIG. 2.

FIG. 7 is a diagram illustrating a representation of an example of the structure of the bit line setup control unit 710 of FIG. 2.

Referring to FIG. 7, the bit line setup control unit 710 outputs a page buffer sensing signal PB_SENSE for controlling the NMOS transistor of the page buffer sensing unit included in the page buffer.

For example, the bit line setup control unit 710 may include a reference voltage amplification unit 711, a ramp signal activation unit 712, and a ramp signal generation unit 713.

The reference voltage amplification unit 711 may output a reference voltage VREF to the ramp signal activation unit 712 in response to a page buffer sensing enable signal PB_SENSE_Enable. In an embodiment, the reference voltage may be a voltage for turning on the NMOS transistor of the page buffer sensing unit. The page buffer sensing enable signal PB_SENSE_Enable may be inputted during a bit line setup interval and may not be inputted during remaining intervals when a program operation is performed.

The ramp signal activation unit 712 may receive a high-voltage enable signal HV_Enable and an inverted high-voltage enable signal HV_Enable_N and may then determine whether to output a ramp signal. For this operation, the ramp signal activation unit 712 may include a PMOS transistor and an NMOS transistor.

The ramp signal generation unit 713 generates a ramp signal, which is gradually increasing over time, using ramp circuits. The ramp signal generation unit 713 may receive a plurality of ramp signals Ramp<0> to Ramp<2>. The ramp signal generation unit 713 may output a ramp signal in response to the inverted high-voltage enable signal HV_Enable_N and a voltage VSSI using the ramp circuits.

In accordance with an embodiment of the present disclosure, the bit line setup control unit 710 outputs the page buffer sensing signal PB_SENSE during the bit line setup interval. The page buffer sensing signal PB_SENSE outputted during the bit line setup interval may have a form in which a step signal is combined with a ramp signal.

For example, if a step signal having the level of the reference voltage VREF is inputted and a preset reference time has elapsed, a ramp signal may be inputted. For this operation, the bit line setup control unit 710 may output a step voltage having the reference voltage level as the page buffer sensing signal PB_SENSE by deactivating the high-voltage enable signal HV_Enable during the interval in which the step signal is inputted.

If the preset reference time has elapsed, the bit line setup control unit 710 may output a ramp signal-shaped voltage as the page buffer sensing signal PB_SENSE by activating the high-voltage enable signal HV_Enable.

Figure 8:
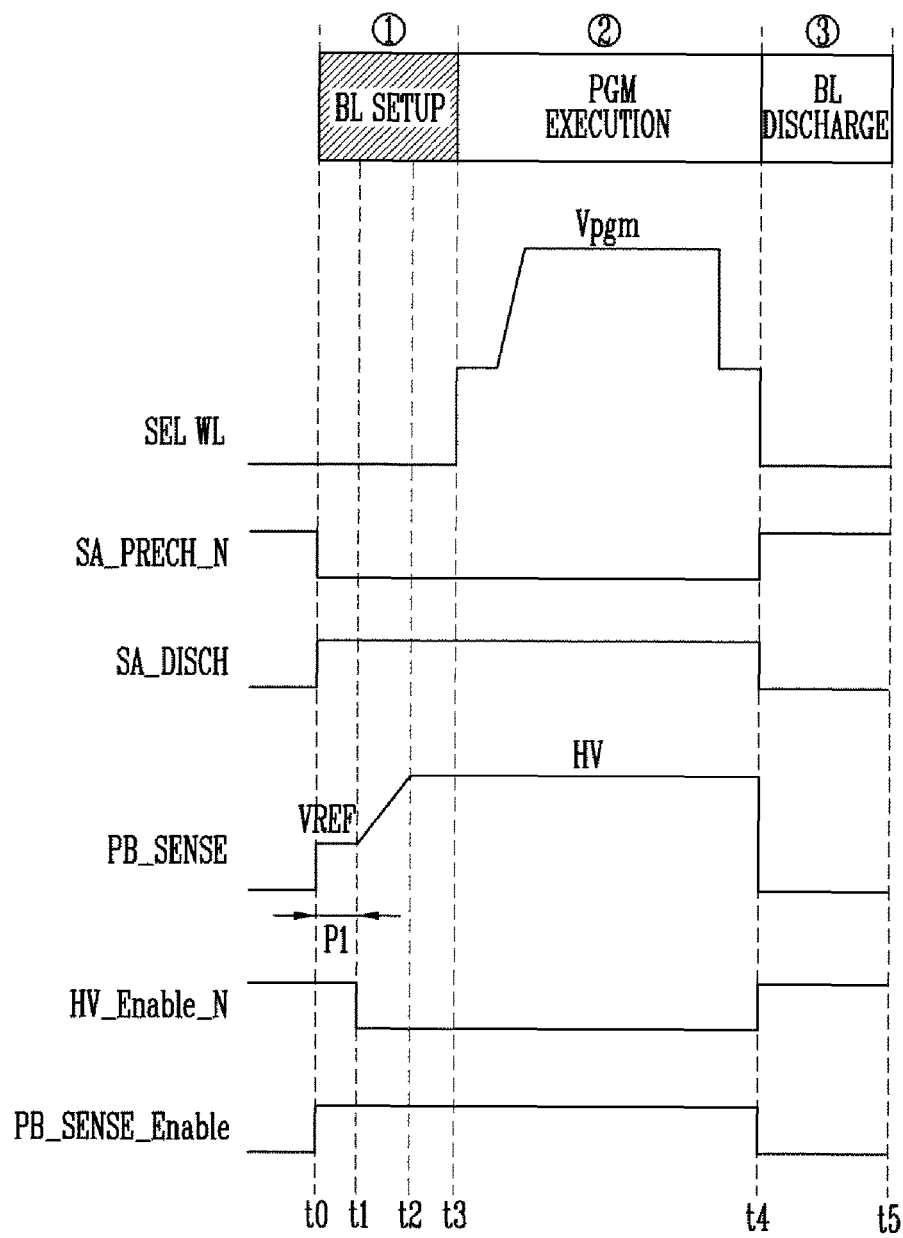
FIG. 8 is a signal diagram illustrating a representation of an example of the waveform of signals applied to the page buffer and the bit line setup control unit during a program operation.

FIG. 8 is a signal diagram illustrating a representation of an example of the waveform of signals applied to the page buffer and the bit line setup control unit during a program operation.

Referring to FIG. 8, a word line voltage SEL WL, page buffer control signals PB_SENSE, SA_PRECH_N, and SA_DISCH, and the internal signals HV_Enable_N and PB_SENSE_Enable of the bit line setup control unit 710, which are applied while a single program step is performed, are illustrated, for example.

The program step may be divided into a bit line setup (BL Setup) interval ①, a program execution (PGM Execution) step ②, and a bit line discharge (BL Discharge) interval ③.

Referring to FIG. 8, an interval of t0 to t3 indicates the BL Setup interval ①, an interval of t3 to t4 indicates the PGM Execution interval ②, and an interval of t4 to t5 indicates the BL Discharge interval ③.

During the BL Setup interval ①, each bit line may be set up according to data to be programmed. For this, the bit line setup control unit 710 outputs the page buffer sensing signal PB_SENSE that is inputted to the NMOS transistor of the page buffer sensing unit, and the page buffer sets up the bit line in response to control signals inputted from the control circuit 700.

At time t0, 0 V may be inputted as the current precharge signal SA_PRECH_N and a turn-on voltage may be inputted as the sense amp discharge signal SA_DISCH in order to charge the bit line. The PMOS transistor P2 may be turned on in response to the current precharge signal SA_PRECH_N, and the NMOS transistor N3 may be turned on in response to the sense amp discharge signal SA_DISCH.

Further, a pulse signal having the level of a reference voltage VREF may be applied as the page buffer sensing signal PB_SENSE. In order to output the pulse signal having the level of the reference voltage VREF as the page buffer sensing signal PB_SENSE, both the inverted high-voltage enable signal HV_Enable_N and the page buffer sensing enable signal PB_SENSE_Enable of the bit line setup control unit 710 may be applied as in the waveform of FIG. 8.

Here, the reference voltage VREF may be a voltage for turning on the NMOS transistor of the page buffer sensing unit.

At time t1, while the inverted high-voltage enable signal HV_Enable_N makes a transition to a low state, the bit line setup control unit 710 outputs a ramp signal as the page buffer sensing signal PB_SENSE. In an embodiment, the length of interval P1, which is an interval during which the reference voltage is applied, may vary depending on the characteristics of the NMOS transistor of the page buffer sensing unit. That is, a step pulse having the reference voltage level may be output as the page buffer sensing signal PB_SENSE during a time which is sufficiently long to turn on the NMOS transistor of the page buffer sensing unit.

At time t2, the page buffer sensing signal PB_SENSE reaches a high voltage (HV) which is a target voltage. In an embodiment, the gradient of the ramp signal applied during an interval of t1 to t2 may have various values. As the gradient of the ramp signal is steeper, the time required for bit line setup may be shortened.

At time t3, a program voltage Vpgm may be applied to a selected word line. Selected memory cells may be programmed based on bit line setup performed during the interval of t0 to t3. Between time t3 and t4, a program pulse may be applied to a selected word line.

When time t4 is reached, the turn-on voltage may be inputted as the current precharge signal SA_PRECH_N and 0 V may be inputted as the sense amp discharge signal SA_DISCH to discharge the bit line. Further, since the page buffer sensing enable signal PB_SENSE_Enable is not inputted, the setup control unit 710 outputs the ramp signal as the page buffer sensing signal PB_SENSE, that is, 0 V. Depending on an operation performed during an interval of t4 to t5, the voltage that was charged in the bit line may be discharged.

Figure 9:
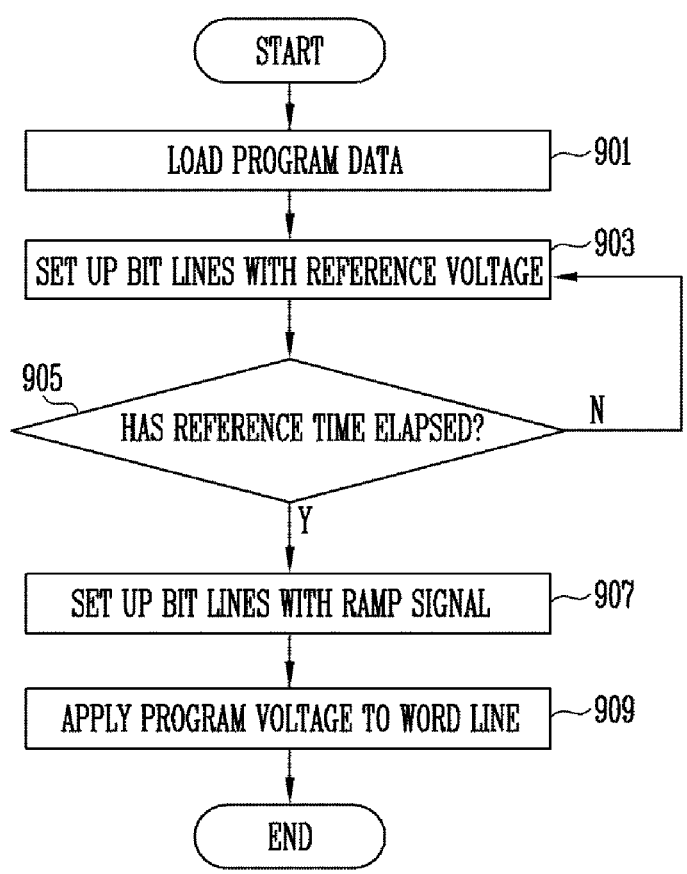
FIG. 9 is a flowchart illustrating a representation of an example of a method of operating a semiconductor memory device according to an embodiment of the present disclosure.

FIG. 9 is a flowchart illustrating a representation of an example of a method for operating the semiconductor memory device according to an embodiment of the present disclosure.

At step 901, the semiconductor memory device may load program data to be programmed to perform a program operation.

At step 903, the semiconductor memory device may set up bit lines based on the loaded program data. For example, the bit lines may be set up so that 0 V is applied to the bit line of memory cells to be programmed and a supply voltage is applied to the bit line of program-prohibited memory cells is prohibited. At this time, a step voltage having the level of a reference voltage VREF may be applied as a gate voltage of the bit line setup transistor of the page buffer. In an embodiment, the reference voltage VREF may be a turn-on voltage of the bit line setup transistor.

At step 905, the semiconductor memory device may determine whether a preset reference time has elapsed. Here, the reference time may be a minimum time which is required to turn on the bit line setup transistor. Until it is determined at step 905 that the reference time has elapsed, step 903 is repeated.

At step 907, the semiconductor memory device may input a ramp signal as the gate voltage of the bit line setup transistor. In an embodiment, as the gradient of the ramp signal has increased, the time required for bit line setup may be shortened.

At step 909, the semiconductor memory device may perform a program operation by applying a program voltage to a selected word line. In an embodiment, the semiconductor memory device may perform a program operation by applying a program pulse to a selected word line.

Figure 10:
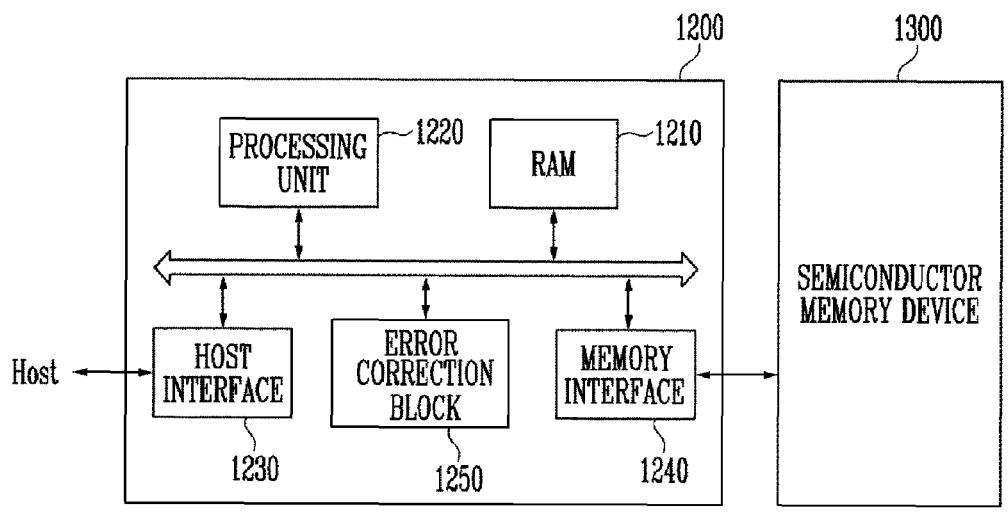
FIG. 10 is a block diagram illustrating a representation of an example of a memory system including the semiconductor memory device of FIG. 2.

FIG. 10 is a block diagram illustrating a representation of an example of a memory system including the semiconductor memory devices of FIG. 2.

Referring to FIG. 10, a memory system includes a semiconductor memory device 1300 and a controller 1200.

The semiconductor memory device 1300 may have the same configuration and operation as the semiconductor memory devices 1000 described with reference to FIG. 2. Hereinafter, repetitive explanations will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls the overall operation of the controller 1200.

The processing unit 1220 is configured to randomize data received from the host Host. For example, the processing unit 1220 may randomize the data received from the host Host using a randomizing seed. The randomized data is provided, as data to be stored, to the semiconductor memory device 1300 and is then programmed in the memory cell array.

The processing unit 1220 is configured to derandomize the data received from the semiconductor memory device 1300 during a read operation. For example, the processing unit 1220 may derandomize the data received from the semiconductor memory device 1300 using a derandomizing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an example of an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface includes a NAND interface or NOR interface.

The error correction block 1250 uses an error correcting code (ECC) to detect and correct an error in data received from the semiconductor memory device 1300.

The controller 1200 and the semiconductor memory device 1300 may be integrated into a single semiconductor device. In an example of an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an example of an embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 11:
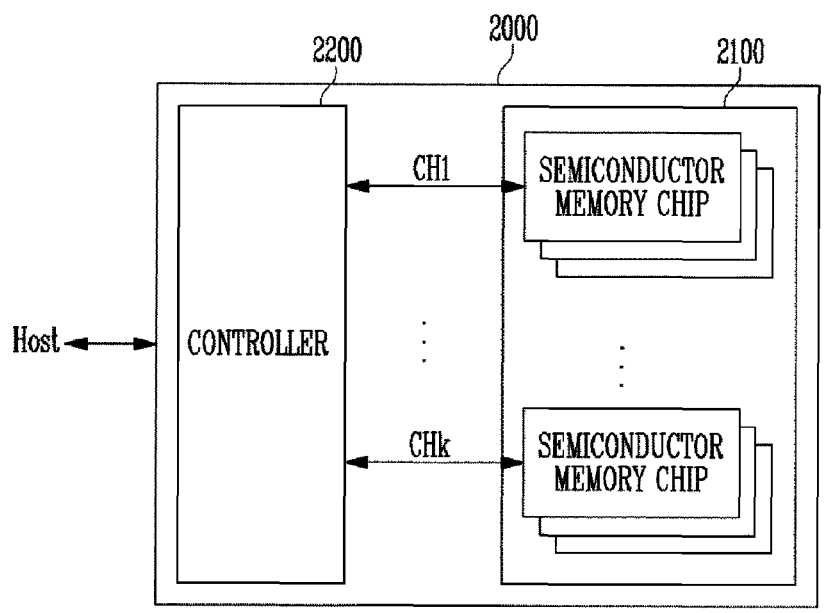
FIG. 11 is a block diagram illustrating an example of an application of the memory system of FIG. 10.

FIG. 11 is a block diagram illustrating a representation of an example of an application of the memory system of FIG. 10.

Referring to FIG. 11, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 11, it is illustrated that each of the plurality of groups communicates with the controller 2200 through first to k-th channels CH1 to CHk. Each semiconductor memory chip may have the same configuration and operation as those of an embodiment of a semiconductor memory device 1000 described with reference to FIG. 2.

Each group communicates with the controller 2200 through one common channel. The controller 2200 has the same configurations as that of the controller 1200 described with reference to FIG. 10 and is configured to control the plurality of memory chips of the semiconductor memory device 2100 through the plurality of channels CH1 to CHk.

In FIG. 11, a description has been made such that a plurality of semiconductor memory chips are coupled to a single channel. However, it will be understood that the memory system 2000 may be modified such that a single semiconductor memory chip is coupled to a single channel.

Figure 12:
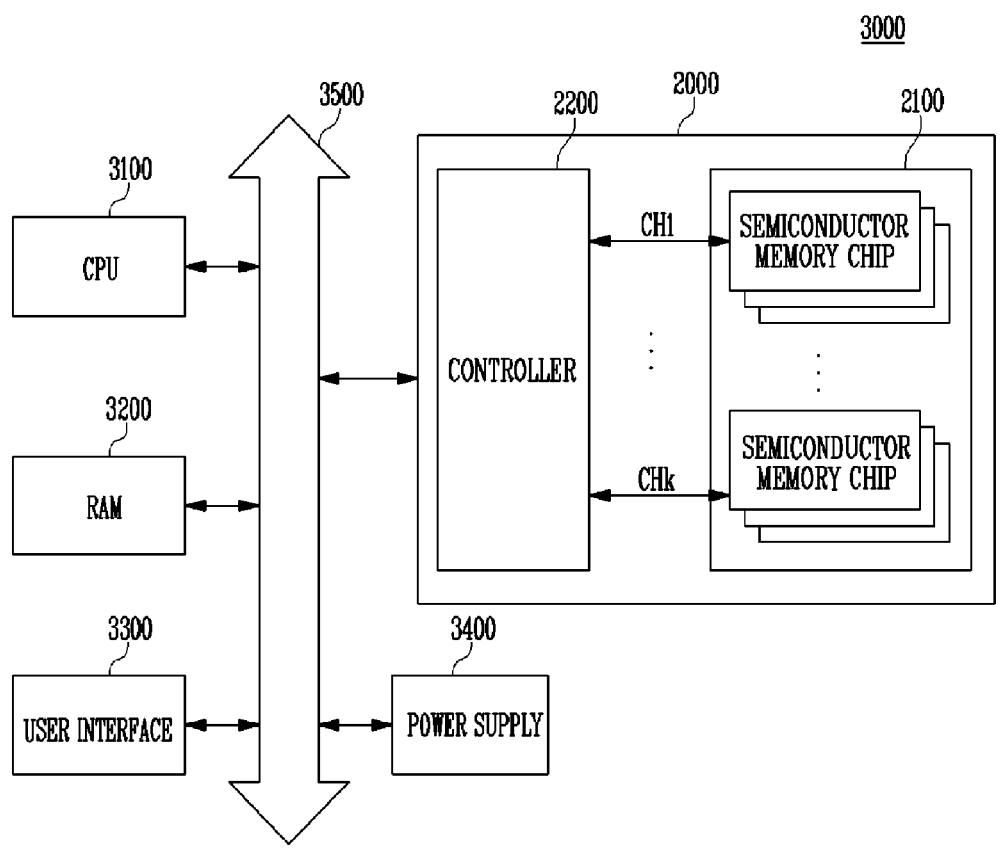
FIG. 12 is a block diagram illustrating a representation of an example of a computing system including the memory system described with reference to FIG. 11.

FIG. 12 is a block diagram illustrating a representation of an example of a computing system including the memory system described with reference to FIG. 11.

Referring to FIG. 12, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 12, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 12, a memory system 2000 described with reference to FIG. 11 is illustrated as being provided. However, the memory system 2000 may be replaced with the memory systems described with reference to FIG. 10. In an embodiment, the computing system 3000 may be configured to include all of the memory systems described with reference to FIGS. 10 and 11.

In accordance with the embodiments of the present disclosure, there are provided a semiconductor memory device which may have improved reliability, and a method of operating the semiconductor memory device.

Although the examples of embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings just aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a semiconductor memory device in which a selected memory cell is programmed, the method comprising:
   applying a control signal having a form, in which a step pulse is combined with a ramp signal, to a gate electrode of a transistor for setting up a voltage of a bit line of the selected memory cell; and
   applying a program pulse to a word line of the selected memory cell.

2. The method according to claim 1, wherein the applying the control signal comprises:
   applying a step pulse having a level of a reference voltage as the control signal; and
   applying a ramp signal having a certain gradient as the control signal if a preset reference time has elapsed.

3. The method according to claim 2, wherein the reference voltage is a turn-on voltage required to turn on the transistor.

4. The method according to claim 2, wherein the reference time is a minimum time required to turn on the transistor.

5. The method according to claim 2, wherein a charging speed of the bit line varies according to the gradient.

6. A semiconductor memory device, comprising:
   a cell array including a plurality of memory cells;
   a page buffer configured to provide a setup voltage to a bit line of a selected memory cell during a program operation; and
   a control circuit configured to control the page buffer so that a control signal having a form, in which a step pulse is combined with a ramp signal, is applied to a gate electrode of a transistor that is included in the page buffer and that sets up a voltage of the bit line.

7. The semiconductor memory device according to claim 6, wherein the control circuit comprises a bit line setup control unit configured to generate the control signal and output the control signal to the page buffer during the program operation.

8. The semiconductor memory device according to claim 7, wherein the bit line setup control unit is configured to apply a step pulse having a level of a reference voltage as the control signal, and apply a ramp signal having a certain gradient as the control signal if a preset reference time has elapsed.

9. The semiconductor memory device according to claim 8, wherein the bit line setup control unit comprises:
   a reference voltage amplification unit configured to output the step pulse having the level of the reference voltage based on a page buffer sensing enable signal that is inputted during a bit line setup interval;
   a ramp signal generation unit configured to generate the ramp signal that is gradually increased over time; and
   a ramp signal activation unit configured to output the ramp signal as the control signal based on a high-voltage enable signal that is inputted if the reference time has elapsed.

10. The semiconductor memory device according to claim 8, wherein the reference voltage is a turn-on voltage required to turn on the transistor.

11. The semiconductor memory device according to claim 8, wherein the reference time is a minimum time required to turn on the transistor.

12. The semiconductor memory device according to claim 8, wherein the bit line setup control unit is configured to determine the gradient to control a charging speed of the bit line.

* * * * *